United States Patent [19]
Watanabe

[11] Patent Number: 4,987,562
[45] Date of Patent: Jan. 22, 1991

[54] SEMICONDUCTOR LAYER STRUCTURE HAVING AN ALUMINUM-SILICON ALLOY LAYER

[75] Inventor: Kiyoshi Watanabe, Yokohama, Japan

[73] Assignee: Fujitsu Limited, Kawasaki, Japan

[21] Appl. No.: 234,781

[22] Filed: Aug. 22, 1988

[30] Foreign Application Priority Data

Aug. 28, 1987 [JP] Japan ................. 62-212837

[51] Int. Cl.$^5$ ............ H01L 23/48; H01L 29/46; H01L 29/52; H01L 29/60
[52] U.S. Cl. .................................. 357/67; 357/71
[58] Field of Search ................ 357/67, 71, 15, 65

[56] References Cited
FOREIGN PATENT DOCUMENTS

| 0024625 | 3/1981 | European Pat. Off. . | |
|---|---|---|---|
| 0082012 | 6/1983 | European Pat. Off. . | |
| 0127281 | 12/1984 | European Pat. Off. . | |
| 51-49767 | 4/1977 | Japan | 357/67 |
| 60-187042 | 9/1985 | Japan | 357/67 |

OTHER PUBLICATIONS

Patent Abstracts of Japan, vol. 9, No. 136 (E-320) (1859) Jun. 12, 1985; & JP-A-60-20568 (Hitachi) 01-0-2-1985.

Patent Abstracts of Japan, vol. 8, No. 247 (E278) (1684), Nov. 13, 1984; & JP-A-59-124765 (Fujitsu) 18-0-7-1948.

Primary Examiner—Rolf Hille
Assistant Examiner—Hoanganh Le
Attorney, Agent, or Firm—Armstrong, Nikaido, Marmelstein, Kubovcik & Murray

[57] ABSTRACT

A semiconductor layer structure includes an alloy layer of aluminum and silicon formed on a silicon substrate. The concentration of silicon contained in the aluminum-silicon alloy layer is within a range of 10 to 75 weight percent. A barrier layer is formed on top of the aluminum-silicon alloy layer, and a metallic layer is formed on top of the barrier layer.

8 Claims, 4 Drawing Sheets

SEMICONDUCTOR LAYER STRUCTURE HAVING AN ALUMINUM-SILICON ALLOY LAYER

BACKGROUND OF THE INVENTION

The present invention generally relates to a semiconductor layer structure having an aluminum-silicon alloy layer, and in particular to a semiconductor layer structure having an aluminum-silicon alloy layer which makes contact with a semiconductor substrate, so that the Schottky barrier contact or ohmic contact can be formed therebetween.

A conventional Schottky barrier diode has a layer structure which contains an n-type silicon (Si) substrate, a silicon dioxide layer ($SiO_2$) having a contact hole, and a metallic electrode formed in the contact hole and on top of the silicon dioxide layer. An interface between the metallic electrode and the silicon substrate forms a Schottky barrier. The metallic electrode contains aluminum (Al), platinum (Pt), tungsten (W), gold (Au) or the like. For example, the metallic electrode may be formed by a pure Al layer. Alternatively, an Al-Si alloy layer may also be used for forming the metallic electrode. The use of an Al-Si alloy layer has been proposed in the Japanese Laid-Open Patent Application Nos. 17563/1984, 124765/1984 and 20568/1985, for example.

The Application No. 175763/1984 discloses an Al-Si alloy layer (first layer) which makes contact with a Si substrate. A barrier layer (second layer) made of titanium nitride (TiN) is formed on the Al-Si alloy, and an interconnection (wiring) layer (third layer) constructed by an Al-Si alloy layer is formed on the barrier layer. The above publication shows that in the case where the first and third layers are constructed by an Al alloy, the Al alloy may have a composition which is the same as a composition of an Al alloy which is generally used as a wiring substance. Normally, an Al-Si alloy used for forming a wiring layer contains Si of up to 2 weight percent (wt. %). The Application No. 20568/1985 also discloses an Al-Si alloy which is used for constructing the Schottky barrier diode and which has the Si concentration of a few percent by weight. That is, using an Al-Si alloy film in which Si of a few percent by weight is contained is the common practice by those skilled in the art.

In general, a rise voltage of the Schottky barrier diode depends on the Schottky barrier height. The rise voltage increases with an increase of the Schottky barrier height. In the case where the Schottky barrier diode is used in a bipolar type static random access memory or a transistor-transistor logic (TTL) circuit, the Schottky barrier diode is required to have a high Schottky barrier height so as to result in a high rise voltage. However, with the Al-Si alloy having the Si concentration of a few percent by weight, it is very difficult to obtain a sufficiently high Schottky barrier height. According to the Application No. 124765/84, in the case where an Al-Si alloy is formed directly on the Si substrate, the Schottky barrier height obtained is equal to 0.65 [eV], although the Si concentration thereof is not shown in the publication. The above value of the Schottky barrier height cannot provide for the rise voltage which satisfies the above requirement well. That is, a Schottky barrier height greater than the above value is desired.

It is known to change layout of a pattern on the substrate to thus obtain a high Schottky barrier height. However, change of layout considerably decreases the degree of freedom of design of LSI devices.

It is conceivable to obtain an increased Schottky barrier height by reducing a contact area of the Al-Si alloy layer on the Si substrate. However, there is a limit on reduction in size of the contact area with the current LSI production techniques. Therefore, the above is not a useful measure.

SUMMARY OF THE INVENTION

Accordingly, a general object of the present invention is to provide a novel and useful semiconductor layer structure having an Al-Si alloy layer in which the above disadvantages are eliminated.

A more specific object of the present invention is to provide a semiconductor layer structure having an Al-Si layer having a sufficiently high Schottky barrier height.

Another object of the present invention is to provide a semiconductor layer structure having an Al-Si layer which is suitable for constructing a Schottky barrier diode used in TTL circuits and bipolar type SRAMs.

The above objects of the present invention are achieved by a semiconductor layer structure which includes a silicon substrate, an alloy layer of aluminum and silicon which is formed on the silicon substrate, the concentration of silicon contained in the aluminum-silicon alloy layer being equal to or more than 10 weight percent, a barrier layer formed on top of the aluminum-silicon alloy layer, and a metallic layer formed on top of the barrier layer.

The above objects of the present invention are also achieved by a semiconductor layer structure including a silicon substrate, a first alloy layer of aluminum and silicon formed on the silicon substrate, the concentration of silicon contained in the first alloy layer being within a range of 10 to 75 weight percent, a barrier layer formed on top of the aluminum-silicon alloy layer, and a second alloy layer of aluminum formed on top of the barrier layer, the concentration of aluminum contained in the second alloy layer being greater than the concentration of aluminum contained in the first alloy layer.

Another object of the present invention is to provide a semiconductor device having an increased Schottky barrier contact and a decreased ohmic contact, such as a Schottky transistor-transistor logic circuit.

The above another object of the present invention is achieved by a semiconductor device including a silicon substrate having an impurity diffused region, a first layer structure formed on top of a surface portion of the silicon substrate which has a conduction type different from the impurity diffused region; and a second layer structure formed on top of the impurity diffused region. Each of the first and second layer structures includes an alloy layer of aluminum and silicon formed on the corresponding surface portion of silicon substrate, the concentration of silicon contained in the aluminum-silicon alloy layer being within a range of 10 to 75 weight percent, a barrier layer formed on top of the aluminum-silicon alloy layer, and a metallic layer formed on top of the barrier layer.

Other objects, features and advantages of the present invention will become apparent from the following detailed description when read in conjuction with the accompanying drawings.

DETAILED DESCRIPTION OF PREFERRED EMBODIMENTS

Figure 1:
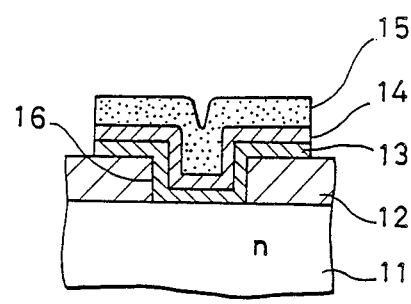
FIG. 1 is an elevational cross sectional view of a preferred embodiment of the present invention.

Referring to FIG. 1, a silicon dioxide ($SiO_2$) layer 12 is formed on top of a semiconductor substrate 11 such as an n-type silicon substrate. A contact hole 16 is formed in the $SiO_2$ layer 12 so that a surface of the silicon substrate 11 is exposed. An alloy layer 13 of aluminum and silicon is formed into the contact hole 16 and the top of the silicon substrate 11. The Al-Si alloy layer may have a thickness of approximately 100 [Å], for example. One of the essential features of the present invention is the ratio by weight between Al and Si contained in the Al-Si alloy layer 13. This is described in detail later. A barrier layer 14 having a thickness equal to or more than 0.1 [$\mu$] is formed on top of the Al-Si alloy layer 13. The barrier layer 14 may be constructed by a titanium nitride (TiN) layer. Nitride of a group to which Ti belongs, such as zirconium and hafnium, or titanium carbon (TiC) may be used in place of TiN. A conduction layer 15 having a thickness of about 1.0 [$\mu$m] is formed on top of the TiN layer 14. The conduction layer 15 forms a Schottky barrier electrode together with the Al-Si alloy layer 13 and TiN layer 14. The conduction layer 15 may be constructed by an Al alloy layer which contains Al as the major component. For example, the Al alloy layer 15 may be constructed by an Al-Cu (copper) alloy layer, an Al-Si alloy layer or the like. The Al alloy layer 15 contains a few percent by weight of a component other than Al. For example, an Al-Cu alloy layer having up to 4 weight percent of Cu, and an Al-Si alloy layer having up to 2 weight percent of Si may be used as the conduction layer 15. In place of alloy layers, it is also possible to use a pure metal such as Al, Au and so on to form the conduction layer 15.

The TiN barrier layer 14 functions as not only a barrier which prevents the interdiffusion between the Al-Si alloy layer 13 and the Al alloy layer 15 but also a barrier which prevents the interdiffusion between the Al alloy layer 15 and the Si substrate 11.

The percentage by weight of Si contained in the Al-Si alloy layer 13 is the important factor for obtaining an increased Schottky barrier height. According to the present invention, the concentration of Si contained in the Al-Si layer 13 is selected so as to be within a range of 10 to 75 weight percent. The range of the concentration of Si contained in the Al-Si alloy layer 13 is clearly distinct from the range of the concentration of Si which is contained in the conduction layer 15.

Figure 2:
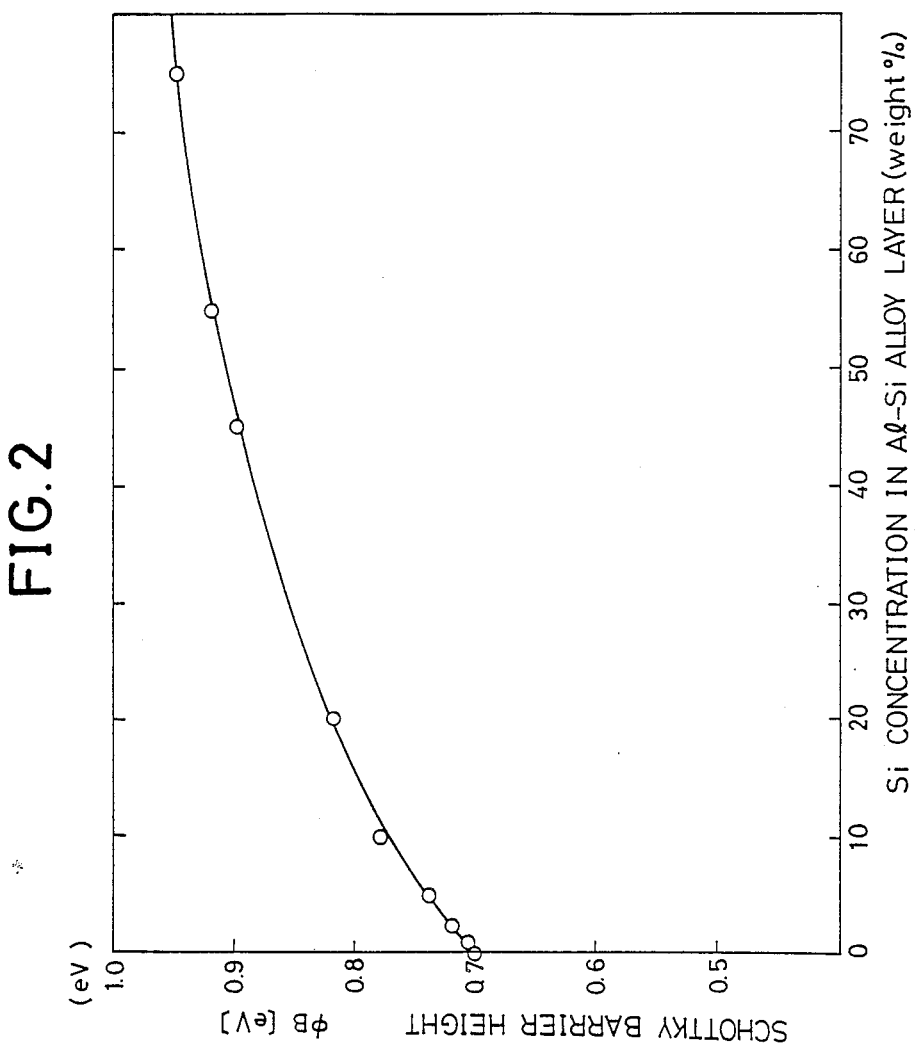
FIG. 2 is a graph showing a relationship between the Si concentration of an Al-Si alloy layer and the Schottky barrier height.

FIG. 2 is a graph obtained by the experiment conducted by the present inventor. A horizontal axis denotes the Si concentration [weight %] contained in the Al-Si alloy layer 13, and a vertical axis denotes the measured Schottky barrier height $\phi_B$ [eV]. In the experiment, the contact hole 16 of 20 [$\mu$m]$\times$20 [$\mu$] was formed in the $SiO_2$ layer 12. The Schottky barrier height $\phi_B$ was measured in the state where a current of 10 [$\mu$A] was allowed to be passed through the Schottky barrier diode of FIG. 1. It can be seen from the graph that the Schottky barrier height $\phi_B$ increases with an increase of the Si concentration of the Al-Si alloy layer 13, and that the Schottky barrier height $\phi_B$ is approximately proportional to the Si concentration. As shown, the Schottky barrier height $\phi_B$ is equal to approximately b 0.7 [eV] for the Si concentration equal to 0 weight percent, and the Schottky barrier height $\phi_B$ is equal to approximately 0.75 [eV] for the Si concentration equal to 10 weight percent.

A difference between the above values, namely 0.05 [eV] makes it possible to increase the rise voltage $V_F$ of the Schottky barrier diode. When the Al-Si alloy layer 13 does not have Si, the measured rise voltage was equal to 310 [mV], and when the Al-Si alloy layer 13 contains Si of 10 weight percent, the measured rise voltage was equal to 360 [mV]. It is noted that the rise voltage of the Schottky barrier diode is proportional to exp $(V-\phi_B)$ (where V is a voltage applied across the diode), and is inversely proportional to the contact area of the Al-Si alloy layer 13 with respect to the Si substrate 11. Therefore, a change of the rise voltage obtained by altering the Schottky barrier height is extremely greater than a change obtained by altering the contact area. It should be noted that when the contact area between the Al-Si alloy layer and the substrate is half as large as the original contact area, an increase of the rise voltage equal to only 20 [mV] is obtained. The rise voltage exceeding 50 [mV] can be obtained by the Al-Si alloy layer 13 which contains Si of more than 10 weight percent.

Additionally, the Schottky barrier height increases continuously with an increase of the Si concentration. Therefore, it is possible to select a desired Schottky barrier height with ease. This results in an advantage that the degree of freedom of design of the Schottky barrier diode is increased.

The graph of FIG. 2 does not show the Schottky barrier height for the Si concentration more than 75 weight percent. This is because an AL-Si alloy target having the Si concentration more than that value was not prepared in the experiment. However, it can be predicted that the Schottky barrier height would be saturated or gradually reduced as the Si concentration increases over 75 weight percent.

The layer structure of FIG. 1 may be obtained in the following process. To begin with, the $SiO_2$ layer 12 is grown on the Si substrate 11 by chemical vapor deposition or the like. Next, the contact hole 16 is formed in the $SiO_2$ layer 12. Then an Al-Si alloy target containing a desired Si concentration is sputtered, and thereby the Al-Si alloy layer 13 is deposited into the contact hole 16 and on the top of the $SiO_2$ layer 12. Subsequently, the TiN barrier layer 14 and the Al alloy layer 15 are deposited in this sequence by sputtering. Thereafter, a resist film (not shown) is deposited on the Al alloy layer 15, and is then patterned. Finally, the Al-Si alloy layer 13, the TiN barrier layer 14 and the Al alloy layer 15 are subjected to an etching process where the patterned resist film is used as mask.

Figure 3:
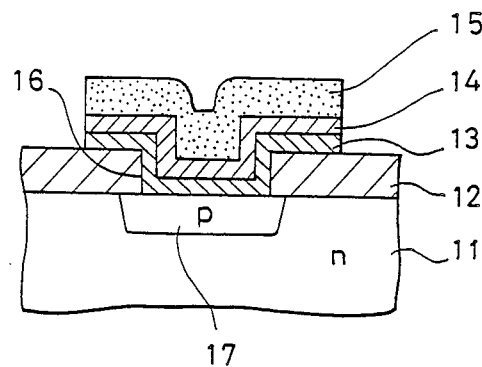
FIG. 3 is an elevational cross sectional view of another preferred embodiment of the present invention.

The inventor found that the Al-Si alloy layer 13 containing the Si concentration within the range of 10 to 75 weight percent contributes to decreasing the ohmic contact resistance, in the case where the Al-Si alloy layer 13 is deposited on an impurity diffused layer formed in the Si substrate 11, as shown in FIG. 3. In FIG. 3, layers identical to those shown in FIG. 1 are indicated by the same reference numerals. An impurity diffused layer 17 is a p-type diffusion layer obtained by diffusing boron (B) or the like, and the surface concentration thereof is equal to $1 \times 10^{19}$ [cm$^{-3}$]. The contact resistance between the Si substrate 11 and the Al-Si alloy layer 13 is continuously decreased with an increase in the Si concentration of the Al-Si alloy layer 13.

Figure 4:
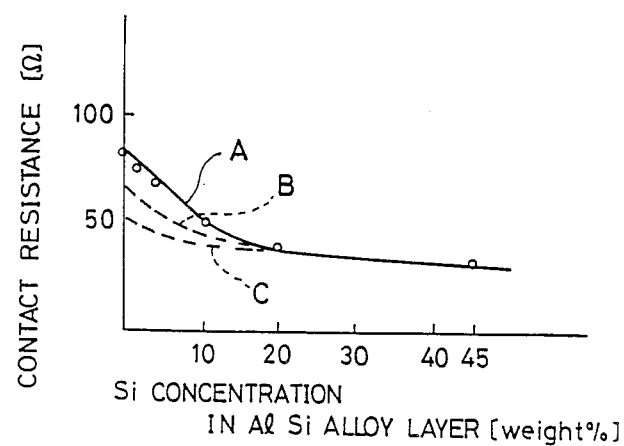
FIG. 4 is a graph showing a relationship between the Si concentration of the Al-Si alloy layer and the ohmic contact.

FIG. 4 is a graph obtained by the experiment conducted by the inventor. In the experiment, the contact hole 16 having a size of 2 [μm]×2 [μm] was formed, and the current equal to 10 [μA] was allowed to be passed through the ohmic contact. The horizontal axis of FIG. 4 denotes the Si concentration [weight percent], and the vertical axis denotes the contact resistance [Ω]. A curve A represents the measured contact resistance for the surface concentration of the p-type diffusion layer 17 equal to $1 \times 10^{19}$ [cm$^{-3}$], and curves B and c represent the measured contact resistances for the surface concentrations equal to $5 \times 10^{19}$ [cm$^{-3}$] and $1 \times 10^{20}$ [cm$^{31\ 3}$], respectively. The graph of FIG. 4 reveals that the contact resistance reduces with an increase of the Si concentration and also with an increase of the surface impurity concentration. The layer structure of FIG. 3 may be obtained by implanting a boron ion into the Si substrate 11 through the contact hole 16 formed in the SiO$_2$ layer 12. The other steps may be the same as those aforementioned.

Figure 5:
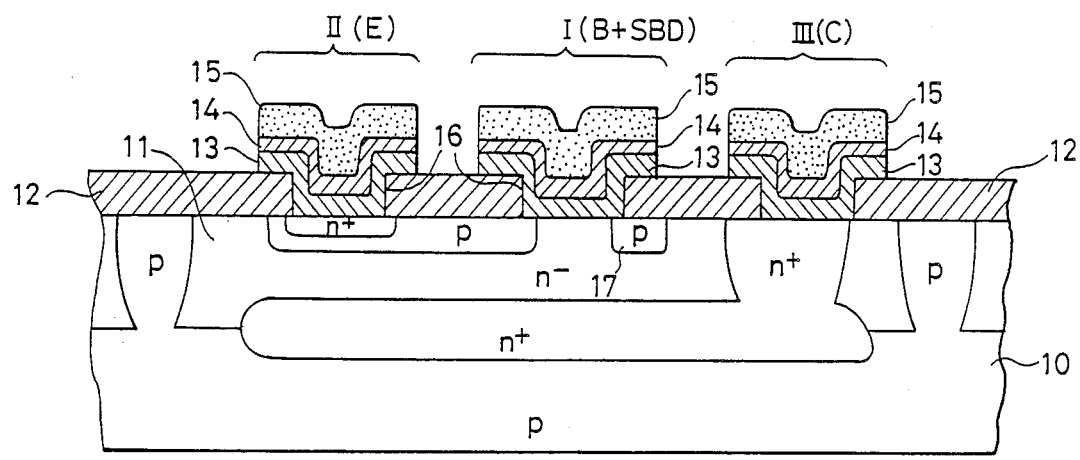
FIG. 5 is an elevational cross sectional view of a semiconductor device including a Schottky barrier contact and an ohmic contact which are formed on a single substrate.

FIG. 5 is an elevational cross sectional view of a semiconductor device which includes the Schottky barrier contact shown in FIG. 1 and the ohmic contact shown in FIG. 3. In FIG. 5, layers identical to those in the previous figures are indicated by the same reference numerals. The illustrated layer structure functions as a bipolar transistor with a Schottky barrier diode. A reference numeral 10 indicates a silicon substrate. Impurity diffused regions are formed in the Si substrate 10 as shown in FIG. 5. A region I functions as a base electrode and a Schottky barrier diode (SBD) which is connected across a collector and the base of the transistor. A region II functions as an emitter electrode, and a region III functions as a collector electrode.

The present invention is not limited to the aforementioned embodiments, and variations and modifications may be made without departing from the scope of the present invention.

What is claimed is:

1. A semiconductor layer structure comprising:
   a silicon substrate;
   an alloy layer of aluminum and silicon formed on the silicon substrate, the concentration of silicon contained in the aluminum-silicon alloy layer being within a range of 10 to 75 weight percent;
   a barrier layer formed on top of the aluminum-silicon alloy layer; and
   a metallic layer formed on top of the barrier layer, the barrier layer preventing the silicon contained in the alloy layer from diffusing into the metallic layer.

2. A semiconductor layer structure as claimed in claim 1, wherein the metallic layer formed on top of the barrier layer is a Schottky barrier electrode.

3. A semiconductor layer structure as claimed in claim 1, wherein the silicon substrate comprises an impurity diffused layer, and the aluminum-silicon alloy layer is formed on the impurity diffused layer.

4. A semiconductor layer structure as claimed in claim 3, wherein the metallic layer formed on the top of the barrier layer is an ohmic contact electrode.

5. A semiconductor layer structure comprising:
   a silicon substrate;
   a first alloy layer of aluminum and silicon formed on the silicon substrate, the concentration of silicon contained in the first alloy layer being within a range of 10 to 75 weight percent;
   a barrier layer formed on top of the aluminum-silicon alloy layer; and
   a second alloy layer of aluminum formed on top of the barrier layer, the concentration of aluminum contained in the second alloy layer being greater than the concentration of aluminum contained in the first alloy layer.

6. A semiconductor layer structure as claimed in claim 5, wherein the second alloy layer is an aluminum-silicon alloy layer, and the concentration of silicon in the second alloy layer is 2% or less by weight.

7. A semiconductor device comprising:
   a silicon substrate having an impurity diffused region;
   a first layer structure formed on top of a surface portion of the silicon substrate which has a conduction type different from the impurity diffused region; and
   a second layer structure formed on top of the impurity diffused region,
   each of the first and second layer structures comprising;
   an alloy layer of aluminum and silicon formed on the corresponding surface portion of silicon substrate, the concentration of silicon contained in the aluminum-silicon alloy layer being within a range of 10 to 75 weight percent;
   a barrier layer formed on top of the aluminum-silicon alloy layer; and
   a metallic layer formed on top of the barrier layer.

8. A semiconductor layer structure as claimed in claim 7, wherein the metallic layer contains aluminum as the major component, and the concentration of aluminum in the metallic layer is greater than the concentration of aluminum in the aluminum-silicon alloy layer.

* * * * *